United States Patent
Landrock et al.

(10) Patent No.: US 11,198,314 B2
(45) Date of Patent: Dec. 14, 2021

(54) NANOSTRUCTURE ARRAY DIFFRACTIVE OPTICS FOR RGB AND CMYK COLOR DISPLAYS

(71) Applicant: IDIT TECHNOLOGIES CORP., Burnaby (CA)

(72) Inventors: Clinton K. Landrock, North Vancouver (CA); Badr Omrane, Burnaby (CA); Yindar Chuo, Burnaby (CA)

(73) Assignee: NANOTECH SECURITY CORP., Burnaby (CA)

(*) Notice: Subject to any disclaimer, the term of this patent is extended or adjusted under 35 U.S.C. 154(b) by 0 days.

(21) Appl. No.: 14/889,816

(22) PCT Filed: May 12, 2014

(86) PCT No.: PCT/CA2014/050444
§ 371 (c)(1),
(2) Date: Nov. 6, 2015

(87) PCT Pub. No.: WO2014/179892
PCT Pub. Date: Nov. 13, 2014

(65) Prior Publication Data
US 2016/0107471 A1      Apr. 21, 2016

Related U.S. Application Data

(60) Provisional application No. 61/822,166, filed on May 10, 2013.

(51) Int. Cl.
G02B 5/20       (2006.01)
B42D 25/328    (2014.01)
(Continued)

(52) U.S. Cl.
CPC ........... *B42D 25/328* (2014.10); *B42D 25/30* (2014.10); *G02B 5/18* (2013.01); *G02B 5/1809* (2013.01);
(Continued)

(58) Field of Classification Search
CPC .... G03H 1/0011; G02B 5/1866; G02B 5/208; G02B 5/1842; G02B 5/18; G02B 5/1852;
(Continued)

(56) References Cited

U.S. PATENT DOCUMENTS 5,784,200 A * 7/1998 Modegi ............... G02B 5/1847
                                                                    359/2
7,628,887 B2 * 12/2009 Jaaskelainen .......... D21H 21/44
                                                                    162/140
(Continued)

FOREIGN PATENT DOCUMENTS

CN      101306615 A     11/2008
DE      10308327 A1     9/2004
(Continued)

OTHER PUBLICATIONS

Kumar et al., Printing colour at the optical diffraction limit, Aug. 12, 2012, Nature Nanotechnology vol. 7, pp. 557-561.

*Primary Examiner* — Audrey Y Chang
(74) *Attorney, Agent, or Firm* — Palmer IP Inc.

(57) ABSTRACT

An RGB and/or CMYK full color optical display device comprising multiple nanostructure arrays configured to provide display of a wide range of colors corresponding to multiple pixels or sub-regions of an image is disclosed, where the multiple nanostructure arrays may be formed on a single substrate layer. An optical display device includes a substrate having a surface, and a first pixel of a color image comprising first and second sub-pixels according to at least one of an additive and subtractive color scheme, where the
(Continued)

first sub-pixel comprises a first optical sub-wavelength nanostructure array formed on or in the surface of the substrate, and where the second sub-pixel comprises a second optical sub-wavelength nanostructure array formed on or in the surface of the substrate. A method of manufacturing an RGB and/or CMYK full color optical display comprising multiple nanostructure arrays arranged as sub-pixels according to a color scheme is also disclosed.

18 Claims, 6 Drawing Sheets

(51) Int. Cl.
  *B42D 25/30* (2014.01)
  *G02B 5/18* (2006.01)
  *H01J 37/317* (2006.01)
(52) U.S. Cl.
  CPC ......... *G02B 5/1842* (2013.01); *G02B 5/1852* (2013.01); *G02B 5/1857* (2013.01); *G02B 5/201* (2013.01); *G02B 5/203* (2013.01); *H01J 37/3174* (2013.01)
(58) Field of Classification Search
  CPC .. G02B 5/1857; B42D 25/324; B42D 25/328; B42D 25/355; B42D 25/30; H01J 37/3174
  USPC ......... 359/2, 569; 283/86; 349/106; 162/140
  See application file for complete search history.

(56) References Cited

U.S. PATENT DOCUMENTS

| | | | |
|---|---|---|---|
| 7,989,254 B2 | 8/2011 | Yoon | |
| 8,593,595 B2* | 11/2013 | Park | G02F 1/133514 349/105 |
| 2005/0270604 A1* | 12/2005 | Drinkwater | F21V 33/006 359/2 |
| 2006/0263539 A1 | 11/2006 | Argoita | |
| 2008/0067801 A1 | 3/2008 | Schilling | |
| 2009/0091644 A1* | 4/2009 | Mackey | B82Y 20/00 348/273 |
| 2009/0174944 A1 | 7/2009 | Yuasa | |
| 2010/0071237 A1 | 3/2010 | Toda | |
| 2010/0025400 A1 | 10/2010 | Toda | |
| 2010/0315714 A1 | 12/2010 | Tompkin et al. | |
| 2011/0007374 A1* | 1/2011 | Heim | G03H 1/0244 359/2 |
| 2011/0069360 A1 | 3/2011 | Dichtl | |
| 2011/0102716 A1 | 5/2011 | Park | |
| 2012/0127547 A1 | 5/2012 | Gocho | |
| 2014/0049812 A1* | 2/2014 | Palanchoke | G02B 5/208 359/360 |
| 2014/0092718 A1* | 4/2014 | Kumar | B82Y 30/00 369/100 |
| 2014/0168651 A1* | 6/2014 | Guo | G01N 21/554 356/445 |

FOREIGN PATENT DOCUMENTS

| | | |
|---|---|---|
| DE | 102011101635 A1 | 11/2012 |
| EP | 0105099 A1 | 4/1984 |
| EP | 2077459 A1 | 7/2009 |
| EP | 2228672 A1 | 9/2010 |
| EP | 2336810 A1 | 6/2011 |
| EP | 2447743 A1 | 5/2012 |
| EP | 2447744 A1 | 5/2012 |
| JP | 2012123102 A | 6/2012 |
| JP | 2012159589 A | 8/2012 |
| WO | 2005/052650 A2 | 6/2005 |
| WO | 2005/122235 A2 | 12/2005 |
| WO | 2008018923 A3 | 2/2008 |
| WO | 2009/090091 A2 | 7/2009 |
| WO | 2011072408 A1 | 6/2011 |
| WO | 2011139785 A2 | 11/2011 |
| WO | 2012156049 A1 | 11/2012 |
| WO | 2013039454 A1 | 3/2013 |
| WO | 2013053435 A1 | 4/2013 |
| WO | 2014023415 A1 | 2/2014 |

* cited by examiner

NANOSTRUCTURE ARRAY DIFFRACTIVE OPTICS FOR RGB AND CMYK COLOR DISPLAYS

CROSS-REFERENCE TO RELATED APPLICATIONS

This application is related and claims priority to U.S. Provisional Patent Application Ser. No. 61/822,166 filed May 10, 2013, which is hereby incorporated herein by reference in its entirety.

TECHNICAL FIELD

The present invention relates generally to optical displays, and more particularly to full color optical security displays using nanostructure arrays, and methods for their manufacture and use.

BACKGROUND OF THE INVENTION

Diffraction Gratings

According to one aspect of the art, diffraction gratings are known which may consist of periodic structures that cause incident light to diffract. In such cases, diffraction may occur both in transmissive (e.g. prisms) or reflective (e.g. CDs and DVDs) modes, and such diffraction may be due to the transparency or reflective nature of the substrate which contains the periodic structure. In such case, the pitch or spacing of the periodic structures, which is typically known as the period of the grating, has an inverse effect on the dispersion angle.

In one such aspect according to the art, an array of nanoholes with periodicity in the visible spectrum ($\lambda$) and hole diameters smaller than $\lambda/2$ may also diffract light to create structural colors. In one such aspect, the physical configuration of the nano-features, as well as the type of lattice and periodicity may define the intensity of the diffracted wavelengths that may be substantially higher than which may be obtained using more conventionally available micro-scale gratings. For any diffraction grating, the intensity of the maxima peaks, in transmission or reflection, increases as a function of the number of slits (N) over a given area, specifically increasing as $N^2$. The colors seen in the first order maxima peaks become more distinguishable leading to higher chromatic resolution—i.e. crisper and clearer defined colors. For example, a diffraction grating with a spacing of 500 nm will exhibit intensity four times that of a grating spaced at 1000 nm, while producing clearly defined color bars. Visually the nanoscale features appear brighter, especially noticeable in dimmer light, and their specific colors appear more solid as the viewing angle changes (i.e. less "rainbowing" of colours). Diffraction gratings split white light into multiple colors. The intensity (I) and chromatic resolution of the colors depend on the size and density of slits in a given area, in accordance with the relation:

$$I \propto \left[\sum_{p=1}^{N/2} \cos\left((2p-1)\pi\frac{d}{\lambda}\sin\theta\right)\right]^2$$

Due to their unique brilliant optical effects, these nanoscale gratings have been implemented in some applications to replace holograms for security applications in some aspects known in the art.

Color Displays

According to another aspect of the art, color optical displays are known which provide for a wide range of colors through use of one or more color definition schemes. In one such aspect, an RGB color scheme or model uses individual red, green and blue subpixels to additively define colors of each RGB composite pixel in an electronic display such as to provide for a range of displayable colors. According to a further aspect of the art, a CMYK color scheme or model uses individual cyan, magenta, yellow, and key (or black) inks or subpixels to subtractively define colors of each CMYK pixel or image sub-region in an electronic display or printed display on a backlit or white substrate, for example.

SUMMARY OF THE INVENTION

Certain features, aspects and examples disclosed herein are directed to RGB and CMYK full color displays using nanostructure arrays, according to an embodiment of the present invention. Certain features, aspects and examples are further directed to a method of manufacturing RGB and CMYK full color displays using nanostructure arrays, according to another embodiment of the present invention. Additional features, aspects and examples are discussed in more detail herein.

In accordance with a first aspect of the present invention, an RGB and/or CMYK full color optical display device comprising multiple nanostructure arrays configured to provide display of a wide range of colors corresponding to multiple pixels or sub-regions of an image is provided, wherein the multiple nanostructure arrays may be formed on a single substrate layer.

In another aspect of the invention, an optical display device is provided comprising a substrate having a surface, and a first pixel of a color image comprising first and second sub-pixels according to at least one of an additive and subtractive color scheme, where the first sub-pixel comprises a first optical sub-wavelength nanostructure array formed on or in the surface of the substrate, and where the second sub-pixel comprises a second optical sub-wavelength nanostructure array formed on or in the surface of the substrate.

In a further complementary aspect of the invention, the optical display device may comprise an optical security device, and the color image comprises optically visible features and is operable to visually authenticate an article comprising the optical security device. In another aspect, the optical display device may comprise a first nanostructure array operable to diffract an incident light source to define a first color of the first sub-pixel, and a second nanostructure array operable to diffract an incident light source to define a second color of the second sub-pixel. In yet another aspect of the invention, the optical display device comprises a first nanostructure array comprising a plurality of nanostructures arranged in a first periodic lattice having a first periodic spacing between the nanostructures, and a second nanostructure array comprising a plurality of nanostructures arranged in a second periodic lattice having a first periodic spacing between the nanostructures, where the first periodic spacing is different from the second periodic spacing.

In accordance with an additional aspect of the present invention, a method of manufacturing an RGB and/or CMYK full color optical display device comprising multiple nanostructure arrays configured to provide display of a wide range of colors corresponding to multiple pixels or sub-regions of an image is provided.

In a particular aspect, a method of manufacturing an optical display device is provided, comprising providing a substrate comprising a surface, forming a first optical sub-wavelength nanostructure array on the substrate surface to form a first sub-pixel of a first pixel of a color image, forming a second optical sub-wavelength nanostructure array on the substrate surface to form a second sub-pixel of a first pixel of a color image, where the first and second sub-pixels define a color of the first pixel of said color image according to an additive or subtractive color scheme.

In a complementary method of manufacturing an optical display device according to an aspect of the invention, forming the first and second nanostructure arrays comprises one or more of printing, imprinting, embossing, stamping, molding, etching or inscribing the nanostructure arrays in or on the substrate surface Further embodiments and advantages of the present invention will become apparent when considering the drawings in conjunction with the detailed description.

BRIEF DESCRIPTION OF THE DRAWINGS

RGB and/or CMYK full color displays, such as optical display devices, using nanostructure arrays and associated methods of manufacture according to the present invention will now be described with reference to the accompanying drawing figures, in which.

DETAILED DESCRIPTION OF SEVERAL EMBODIMENTS

In one embodiment of the present invention, a full color RGB and/or CMYK color display according to an aspect of the present invention may comprise an optical display device comprising a substrate where a surface of the substrate is imprinted or embossed (or otherwise patterned) with optical sub-wavelength nanostructure arrays such as nanohole arrays to create a full color high resolution imagery using diffraction of reflected and/or transmitted incident light. In another embodiment, a full color RGB and/or CMYK color display, such as an optical display device, comprising a substrate imprinted or embossed (or otherwise patterned) with sub-wavelength nanostructure arrays such as nanohole arrays to create a full color high resolution image may be applied as an optical security device that can in turn be used to visually authenticate a separate entity (such as a document, currency, component or other security item) that may contain the substrate. In a particular such embodiment, an optical security device may be applied to or used to visually authenticate an entity or article such as but not limited to banknotes, passports, security documents, tickets, security badges and passes, brand authentication, labels or certificates of authenticity for wholesale and retail products, and surfaces of such products themselves, for example.

According to a particular embodiment of the invention, RGB or CMYK based color schemes or models can be created by nanostructure displays according to the invention, such as by using nanostructure arrays, such as nanohole arrays, to form individual color pixels or image sub-regions according to RGB and/or CMYK color schemes to display a desired color image. In another embodiment, the nanohole arrays can be configured and treated as pixels or image sub-regions that can be less than a micron in size, allowing for extremely high-resolution color imagery to be produced. In one such embodiment of the invention, the diffraction characteristics and high resolution color imagery that can be produced using sub-wavelength nanostructure arrays, such as nanohole arrays, are unique and therefore replication of these effects using any other technique would be expected to be difficult, if not improbable, making this technology highly suitable for security optics and/or optical display applications. In the present disclosure, the term pixel may comprise any sub-region or regions of a color image, or an entire color image in the case of where the entire color image has a single color or visual effect, for example.

Figure 1:
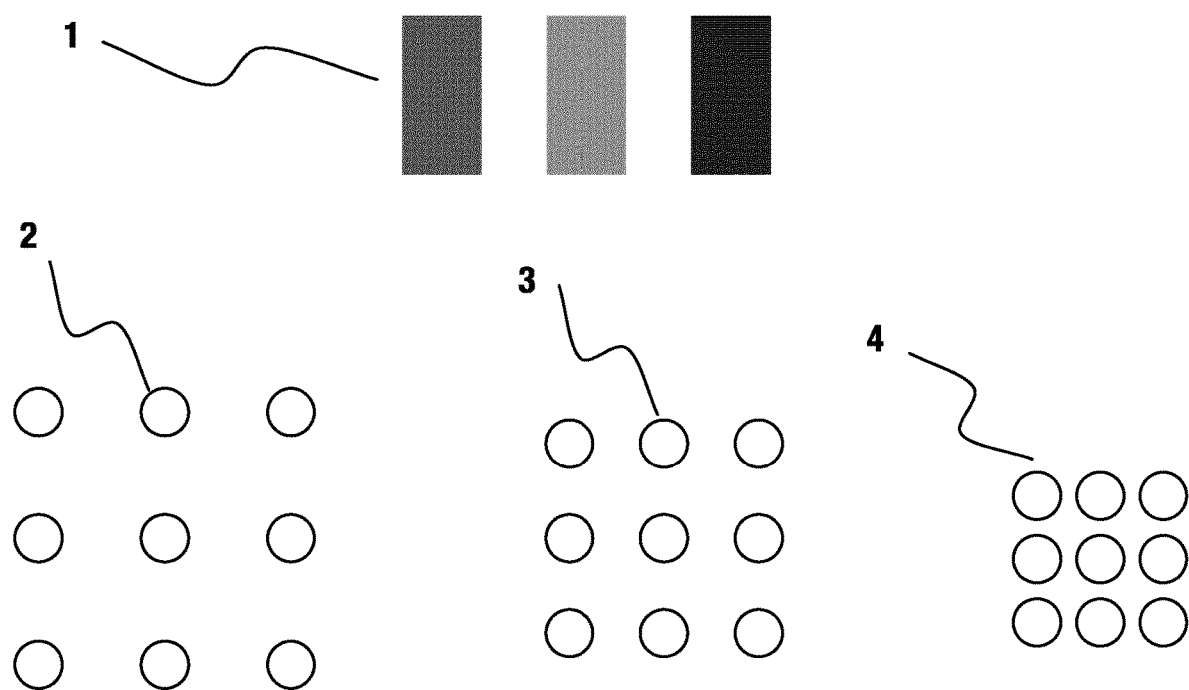
FIG. 1 illustrates a schematic view of an exemplary RGB color display comprising multiple nanostructure arrays configured to create each of red, green and blue component colors of an RGB sub-pixel or image sub-region by diffraction of reflected or transmitted incident white light, according to an embodiment of the present invention.

Referring now to FIG. 1, a schematic view of an exemplary RGB color display, such as an optical display device, comprising multiple nanostructure arrays configured to create each of red, green and blue sub-pixel colors of an RGB display pixel or image sub-region by diffraction of reflected or transmitted incident white light is shown, according to an embodiment of the present invention. In the exemplary RGB display pixel 1 shown in FIG. 1, the red sub-pixel may be displayed by a first nanostructure array such as nanohole array 2 which has a first array configuration (including periodicity or spacing between nanostructures making up the array, shape of the array lattice such as the exemplary square lattice array shown, and size of nanostructures such as the nanoholes forming the array). Correspondingly, the green sub-pixel may be displayed by a second nanostructure array such as nanohole array 3 which has a second array configuration, and the blue sub-pixel may be displayed by a third nanostructure array such as nanohole array 4 which has a third array configuration. In one embodiment, the spacing between the red, green and blue sub-pixels of the composite RGB display pixel 1 may desirably be spaced or pitched such that the red, green and blue sub-pixels are sufficiently distant from the adjacent sub-pixels to desirably reduce and/or avoid destructive optical interference between the light diffracted by the nanostructure arrays 2, 3, 4 of adjacent sub-pixels, but also such that the red, green and blue sub-pixels are sufficiently close to adjacent sub-pixels so as to desirably maintain color mixing effects (such as constructive interference and/or non-interference color mixing) to create the desired apparent color of the composite RGB pixel 1.

In an embodiment of the present invention, the nanostructure arrays used to form each color or sub-pixel of an exemplary RGB and/or CMYK color display may comprise any suitable periodic nanostructure array that may be used to provide a diffractive effect on incident light to display the desired color, such as periodic sub-wavelength nanohole arrays, or periodic arrays of other nanostructures, such as but not limited to nano-columns, nano-bumps, nano-bosses, nano-indents, or other nanostructures which may be formed in a periodic nanostructure array on any suitable substrate surface, such as by nano-imprinting, casting, embossing, masked deposition, self-assembly, or any other suitable nanostructure formation technique. Suitable substrates may comprise but are not limited to films, surfaces or layers of metallic, polymer, composite, cellulose, non-metallic or other suitable substrate materials, for example. In an alternative embodiment, the sub-pixel nanostructure arrays used to form composite RGB and/or CMYK pixel units in a color display may be arranged in a substantially non-rectangular alignment with respect to adjacent sub-pixels, including but not limited to hexagonal, triangular, or other geometric alignments. In one such alternative embodiment, the substantially non-rectangular alignment of the nanostructure arrays used to form adjacent cooperating sub-pixels may desirably limit the viewability of the RGB and/or CMYK pixel to a limited range of viewing angles, leaving the pixel substantially unviewable to a viewer located outside a particular or desired viewable range of viewing angles, for example.

Figure 2:
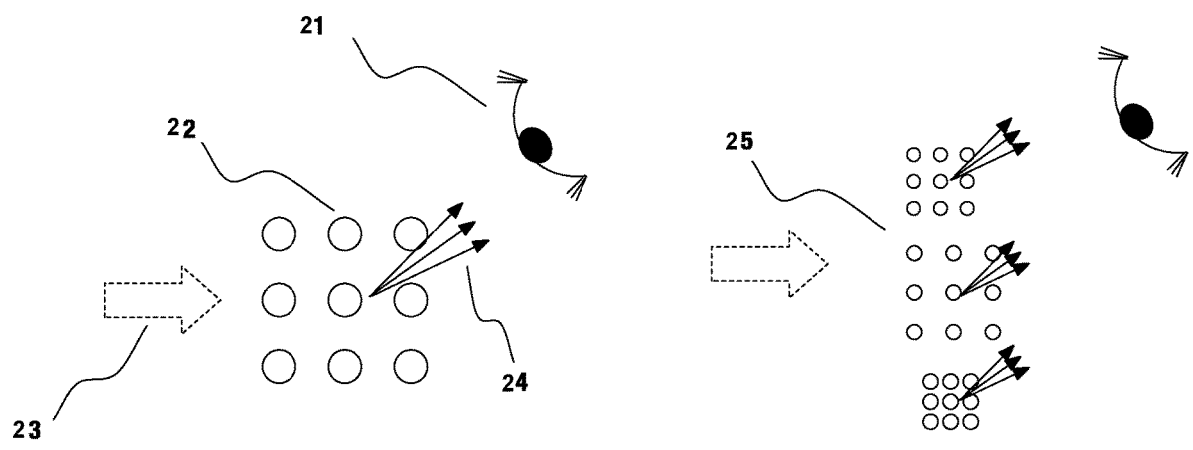
FIG. 2 illustrates a schematic view of exemplary nanostructure array configurations for providing selective diffraction of incident light to form multiple colors of a full color RGB and/or CMYK display, according to an embodiment of the invention.

Referring now to FIG. 2, a schematic view of exemplary nanostructure array configurations for providing selective diffraction of incident light to form multiple colors of a full color RGB and/or CMYK display, such as on an optical display device, is shown, according to an embodiment of the invention. An exemplary first nanostructure array, such as nanohole array 22, may act to diffract a diffuse incident light source 23, to form diffracted reflected and/or transmitted light 24 which is viewable by a viewer or observer 21. In one embodiment, the color of light seen by the observer in the diffracted light 24 reflected and/or transmitted by the nanohole array 22 may be determined by the periodicity and nanohole size of the nanohole array 22. Similarly, in a multi-color sub-pixel color scheme such as an RGB and/or CMYK color scheme, one or more nanostructure arrays such as nanohole arrays 25 may be configured such that diffuse incident light is diffracted to form one or more individual colors to produce singular, additive and/or subtractive colors for representing individual pixels or image sub-regions of a desired color image in a nanostructure display, such as an optical display device, according to embodiments of the invention.

Figure 3:
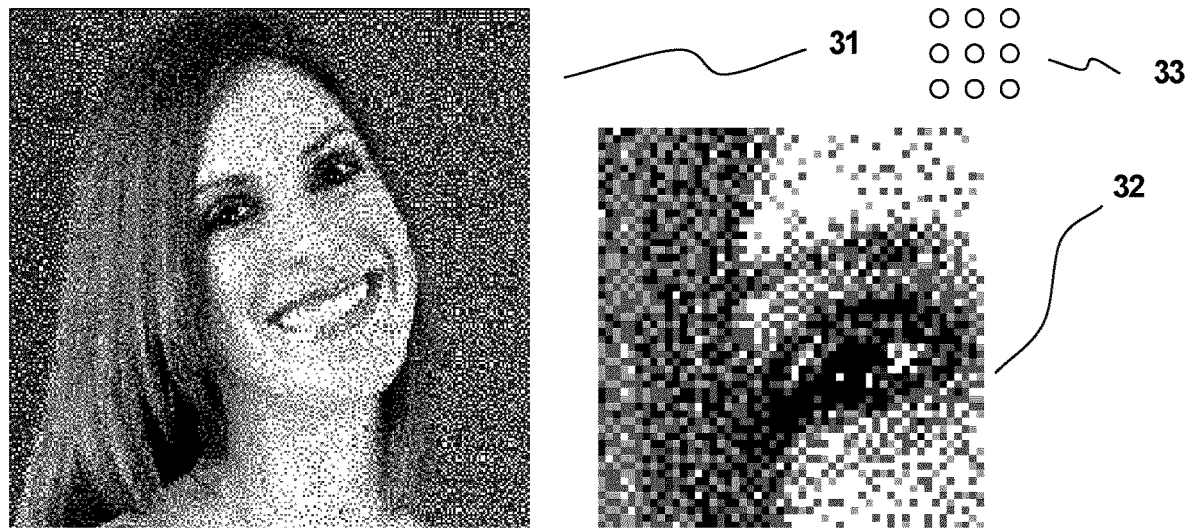
FIG. 3 illustrates a schematic view of an exemplary full color RGB and/or CMYK nanostructure display showing a full color image comprising individual color pixels or image sub-regions, each pixel comprising nanostructure arrays arranged in one or more predetermined configurations to provide a desired color of each pixel, according to an embodiment of the invention.

Referring now to FIG. 3, a schematic view of an exemplary full color RGB and/or CMYK nanostructure display showing a full color image comprising individual color pixels or image sub-regions, each pixel or sub-region comprising nanostructure arrays arranged in one or more predetermined configurations to provide a desired color of each pixel is shown, according to an embodiment of the invention. In the exemplary embodiment shown in FIG. 3, a full exemplary image 31 desired to be shown in a nanostructure display, such as an optical display device, is shown (exemplary image of a woman's face). In one such embodiment, a desired image may be processed, such as by using computer aided design software, to assign each color pixel or sub-region of the image 32 as one or more nanostructure arrays with a pre-defined periodicity and size of nanostructures such as nanoholes. In one embodiment, each color pixel may be assigned as one or more nanostructure arrays 33 using an RGB and/or a CMYK color scheme. The periodicity of each nanostructure array may be chosen based on the desired first order diffracted color produced by the nanostructure array. In a particular embodiment using an RGB scheme, a nanostructure periodicity of about 580 nm-680 nm, and more particularly about 600 nm may be assigned for Red; a nanostructure periodicity of about 480 nm-580 nm, and more particularly about 500 nm for Green; and a nanostructure periodicity of about 380 nm-480 nm, and more particularly about 450 nm for Blue, for example. In another particular embodiment, black pixels may be created by choosing a tightly packed nanostructure array which may desirably absorb most of the visible spectrum (e.g. nanostructure arrays with nanostructure periodicity of less than or equal to about 350 nm). Alternatively the black pixels or areas may be left as blank spaces if the substrate to be imprinted is dark or black. In another particular embodiment, white pixels or areas may be created using a combination of smaller RGB arrays, or alternatively can be left as blank spaces if the image is to be reproduced on white, light colored or mirrored substrates. The size of the nanostructure arrays can be tuned to match the desired resolution of the image to be represented, such as by using pixels or image sub-regions of any desired size. In one particular embodiment, pixels may be between 1 and 5 um in size, for example.

Figure 4:
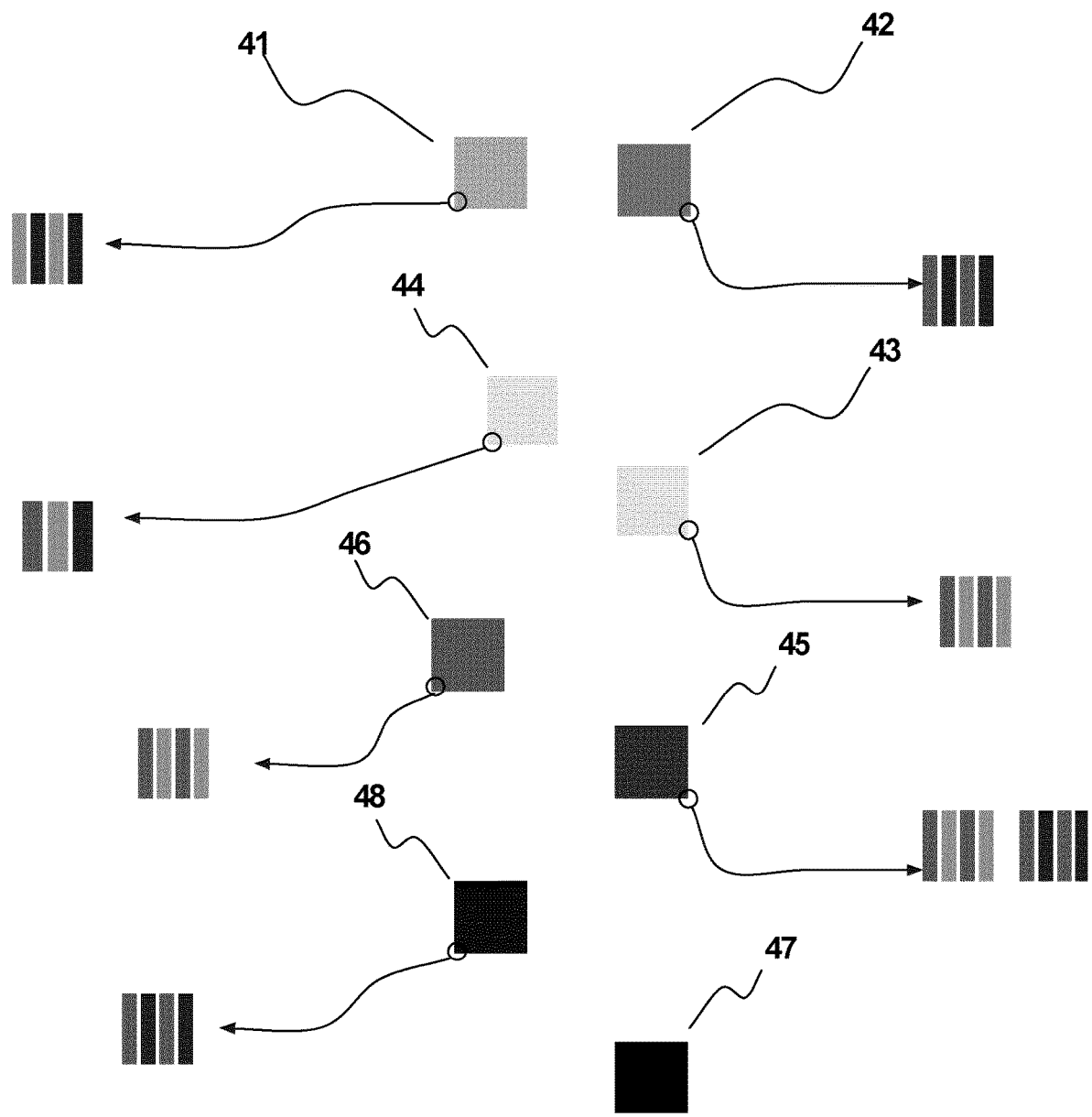
FIG. 4 illustrates a schematic view of an exemplary color pixel chart showing RGB and CMYK sub-pixel colors formed by banded nanostructure array color bars arranged at in predetermined configurations to display the desired sub-pixel color, according to an embodiment of the invention.

Referring now to FIG. 4, a schematic view of an exemplary color pixel chart showing RGB and CMYK sub-pixel colors formed by banded nanostructure array color bars arranged at in predetermined configurations to display the desired sub-pixel color is shown, according to an embodiment of the invention. In one embodiment, individual pixel or sub-pixel colors may be formed by using banded nanostructure arrays of different periodicities (or other array configuration factors) to produce closely spaced bands of adjacent colors to represent a desired pixel or sub-pixel color in a desired color scheme, such as an RGB and/or CMYK color scheme. In a particular embodiment of the invention, color bars may be desirably closely spaced, such as by using color bars of 1-5 um in width and spaced between 2-4 um apart, for example. In one particular embodiment, color pixels for a CMYK color scheme in a full color nanostructure array display may be represented as a cyan pixel 41 having nanostructure arrays arranged in adjacent bands with periodicities of about 520 nm and about 440 nm; a magenta pixel 42 having nanostructure arrays arranged in adjacent bands with periodicities of about 600 nm and about 440 nm; a yellow pixel 43 having nanostructure arrays arranged in adjacent bands with periodicities of about 600 nm and about 500 nm; and a black pixel 47 having nanostructure arrays with a periodicity of about 300 nm, for example. Similarly, in a particular embodiment, additional color pixels for an exemplary CMYK color scheme in a full color nanostructure array display may be represented as a CMYK green pixel 46 having nanostructure arrays arranged in adjacent bands with periodicities of about 500 nm, 440 nm, and 600 nm; a CMYK red pixel 45 having nanostructure arrays arranged in adjacent bands with periodicities of about 600 nm, 500 nm and 440 nm; a CMYK blue pixel 48 having nanostructure arrays arranged in adjacent bands with periodicities of about 500 nm, 440 nm and 600 nm; and a white pixel 44 having nanostructure arrays arranged in adjacent bands with periodicities of about 600 nm, 500 nm and 440 nm, for example.

In another embodiment RGB and/or CMYK pixels may be formed using substantially adjacent bands or other cooperating configurations of multiple nanostructure arrays (such as nanohole arrays) having other periodicities suitable to produce a desired pixel color or optical effect.

Figure 5:
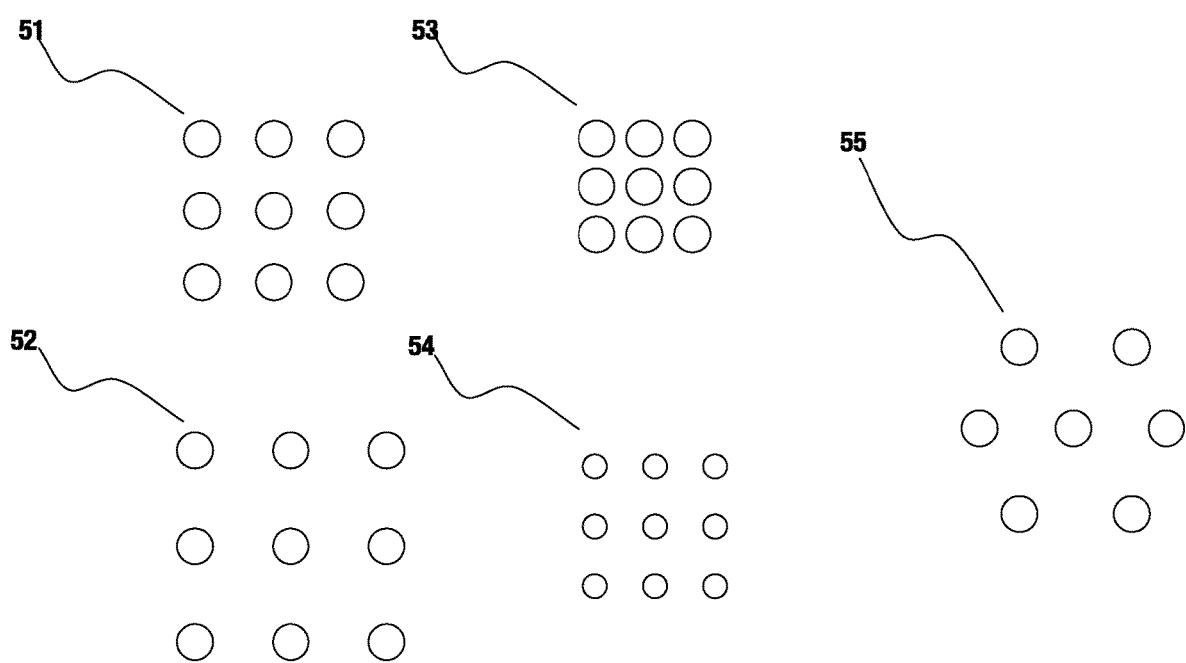
FIG. 5 illustrates a schematic view of exemplary square and hexagonal lattice nanostructure arrays for providing selective diffraction of incident light at different wavelengths, colors, and intensities, according to an exemplary embodiment of the invention.

Referring now to FIG. 5, a schematic view of exemplary square and hexagonal lattice nanostructure arrays for providing selective diffraction of incident light at different wavelengths or colors is shown, according to an exemplary embodiment of the invention. In one embodiment, a full color RGB and/or CMYK nanostructure array display, such as an optical display device, according to the invention may comprise one or more exemplary nanostructure array configurations, such as exemplary square lattice nanohole arrays 51, 52, 53 and 54, and exemplary hexagonal lattice nanohole array 55. In a particular embodiment, array 51 may comprise a typically average spaced and sized square lattice nanohole array for a particular desired periodicity; array 52 may comprise a widely spaced square lattice nanohole array for a particular desired periodicity; array 53 may comprise a narrowly spaced or densely packed square lattice nanohole array for a particular desired periodicity, such as may be used for providing a black pixel; array 54 may comprise an average spaced square lattice nanohole array having smaller sized nanoholes for a particular desired periodicity; and array 55 may comprise a typically average spaced and sized hexagonal lattice nanohole array for a particular desired periodicity. In one embodiment, the spacing or periodicity of a nanohole array may be selected to determine a primary wavelength of light which may be preferentially reflected and/or transmitted by the nanohole array. In another embodiment, the size of the nanoholes in an array may be selected to determine the relative brightness of the light which may be preferentially reflected and/or transmitted by the nanohole array, and/or the bandwidth or range of wavelengths which may be preferentially reflected and/or transmitted by the nanohole array, for example. In yet another embodiment, the nanostructure array shape or lattice geometry (such as rectangular or hexagonal for example) may be selected to determine a desired the viewable angle or range of viewable angles which may be preferentially reflected and/or transmitted by the nanostructure array, for example.

Figure 6:
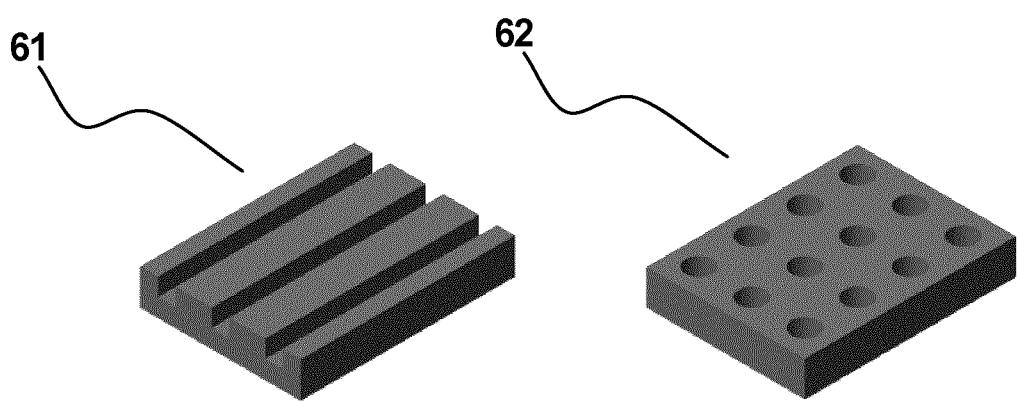
FIG. 6 illustrates an isometric view of an exemplary diffraction grating 61 and an exemplary nanohole array 62.

Referring now to FIG. 6, an isometric view of an exemplary diffraction grating 61 and an exemplary nanohole array 62 is shown, according to an embodiment of the invention. In one such embodiment, the diffraction grating 61 may comprise any suitable micro or nanoscale substantially linear feature which may be aligned with adjacent such features with a suitable periodic spacing (preferably sub-wavelength period) to form an optical diffraction grating. Further, in another such embodiment, the nanohole array 62 may comprise a substantially rectangular (or other lattice geometry or configuration as described above and below) periodic lattice of nanoholes extending in and/or through a substrate surface, so as to provide a nanohole array suitable to cause optical diffraction of at least one desired wavelength of light, for example.

In one embodiment of the invention, a full color RGB and/or CMYK nanostructure array display, such as an optical display device, may comprise nanostructure arrays arranged in arrays having lattice configurations comprising at least one of: square, hexagonal, octagonal, pentagonal, concentric or penrose-tiled (aperiodic) lattice geometries. In another embodiment, the nanostructure arrays may be arranged in one or more other suitable lattice geometries.

In a further embodiment of the invention, a full color RGB and/or CMYK nanostructure array display, such as an optical display device, may comprise nanostructure arrays comprising nanoholes, where the geometry of the nanoholes comprising the array are selected from one or more of circular, substantially round, elliptical, rectangular, triangular or square hole geometries. In another embodiment, the nanoholes of the nanostructure arrays may be shaped in one or more other suitable geometries.

In another embodiment of the invention, an optical security device may be provided comprising a single layer substrate imprinted or embossed with sub-wavelength nanostructure (such as nanohole) arrays to create at least one of RGB and CMYK color gamut high resolution images via diffraction of reflected or transmitted incident light that can be used to visually authenticate a separate entity or article that may contain said substrate. In a further such embodiment of the invention, an optical security device may comprise at least two sets of nanostructure arrays, such as nanohole arrays, each having at least one pre-defined periodic spacing (periodicity) between the nanostructure (such as holes) of the arrays. In yet a further such embodiment, an optical security device may also comprise a plurality of pixels or sub-areas of a color image, wherein each pixel comprises at least two sets of nanostructure arrays, such as nanohole arrays, that exhibit at least two different periodicities for producing at least two corresponding first order diffractive colors. In another such embodiment, an optical security device may also comprise nanostructure arrays, such as nanohole arrays, exhibiting at least one periodic array lattice type selected from the list comprising: square, hexagonal, octagonal, concentric, and penrose tiled lattices. In yet another such embodiment, an optical security device may also comprise nanostructure arrays, such as nanohole arrays, with at least one specified nanostructure or hole geometry selected from the list comprising: circles, ellipses, rectangles, squares and triangles.

In a further embodiment of the present invention, a method for creating an optical display device, such as an optical security device, is provided, wherein the method comprises: writing, mastering or otherwise creating sub-wavelength nanostructure arrays, such as nanohole arrays, on a shim or master substrate surface comprising at least two nanostructure arrays, such as nanohole arrays, arranged in pixels or image sub-regions and having different array periodicities and/or nanostructure (such as nanohole) dimensions, to provide individual pixel or image sub-region colors as part of a high resolution color display. In one embodiment, the nanostructure arrays, such as nanohole arrays, may be created using electron beam lithography, or another suitable nanoscale writing technique and/or device. In another embodiment, the method additionally comprises printing, imprinting, embossing, stamping, molding, or otherwise forming that at least two nanostructure arrays, such as nanohole arrays, forming the image frames onto a suitable single layer substrate to form the optical display device, such as an optical security device.

The exemplary embodiments herein described, including what is described in the Abstract, are not intended to be exhaustive or to limit the scope of the invention to the precise forms disclosed. They are chosen and described to explain the principles of the invention and its application and practical use to allow others skilled in the art to comprehend its teachings.

As will be apparent to those skilled in the art in light of the foregoing disclosure, various equivalent alterations and modifications are possible in the practice of this invention without departing from the scope of the disclosure.

Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment. Further, the described features, structures, or characteristics of the present disclosure may be combined in any suitable manner in one or more embodiments. In this Detailed Description, numerous specific details are provided for a thorough understanding of embodiments of the disclosure. One skilled in the relevant art will recognize, however, that the embodiments of the present disclosure can be practiced without one or more of the specific details, or with other methods, components, materials, and so forth. In other instances, well-known structures, materials, or operations are not shown or described in detail to avoid obscuring aspects of the present disclosure.

The scope of the present disclosure fully encompasses other embodiments and is to be limited, accordingly, by nothing other than the appended claims, wherein any reference to an element being made in the singular is intended to mean "one or more", and is not intended to mean "one and only one" unless explicitly so stated. All structural and functional equivalents to the elements of the above-described preferred embodiment and additional embodiments are hereby expressly incorporated by reference and are intended to be encompassed by the present claims. Moreover, no requirement exists for an apparatus or method to address each and every problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, work-piece, and fabrication material detail may be made, without departing from the spirit and scope of the present disclosure, as set forth in the appended claims, are also encompassed by the present disclosure.

What is claimed is:

1. An optical display device formed on a surface of a substrate, the optical display device comprising:
   a plurality of pixels of a color image, each pixel comprising first and second sub-pixels according to at least one of an additive and subtractive color scheme;
   wherein said first sub-pixel comprises a first optical nanostructure array formed on or in the surface of said substrate;
   wherein said second sub-pixel comprises a second optical nanostructure array formed on or in the surface of said substrate,
   wherein said first and second optical nanostructure arrays each comprise a plurality of nanostructures and said nanostructures comprise one or more of nanoholes and nano-columns formed on or in said surface of said substrate,
   wherein said first optical nanostructure array comprises nanostructures with a periodic spacing of 380 nm to 580 nm to produce a blue or green color by first order diffraction and the second optical nanostructure array comprises nanostructures with a periodic spacing of 580 nm to 680 nm to produce a red color by first order diffraction, whereby the first and second optical nanostructure arrays diffractively provide by the reflection of an incident light source the different colored sub-pixels of a pixel of the plurality of pixels.

2. The optical display device according to claim 1, wherein the optical display device comprises an optical security device, and wherein said color image comprises optically visible features and is operable to visually authenticate an article comprising said optical security device.

3. The optical display device according to claim 1, wherein said first nanostructure array is operable to diffract a reflected incident light source to define a first color of said first sub-pixel; and said second nanostructure array is operable to diffract a reflected incident light source to define a second color of said second sub-pixel.

4. The optical display device according to claim 1, wherein said first nanostructure array comprises a plurality of nanostructures arranged in a first periodic lattice having a first periodic spacing between said nanostructures, and said second nanostructure array comprises a plurality of nanostructures arranged in a second periodic lattice having a second periodic spacing between said nanostructures, and wherein said first periodic spacing is different from said second periodic spacing.

5. The optical display device according to claim 4, wherein said first and second periodic lattices each comprise one or more of a square, hexagonal, octagonal, pentagonal or Penrose lattice geometry.

6. The optical display device according to claim 1, wherein said first and second sub-pixels of said first pixel of said color image are substantially overlaid on each other or interleaved with each other on said substrate.

7. The optical display device according to claim 1, wherein said first and second sub-pixels of said first pixel of said color image are located substantially adjacent to each other on said substrate.

8. The optical display device according to claim 1, wherein said substrate comprises a film, surface or layer of at least one of a metallic, polymer, composite, or cellulose substrate material, or combinations thereof.

9. The optical display device according to claim 1, wherein said color scheme comprises an additive RGB color scheme.

10. The optical display device according to claim 9, wherein said second sub-pixel comprises a red sub-pixel of said RGB color scheme.

11. The optical display device according to claim 9, wherein said first optical nanostructure array comprises nanostructures with a periodic spacing of about 480 nm to 580 nm, and said first sub-pixel comprises a green sub-pixel of said RGB color scheme.

12. The optical display device according to claim 9, wherein said first optical nanostructure array comprises nanostructures with a periodic spacing of about 380 nm to 480 nm, and said first sub-pixel comprises a blue sub-pixel of said RGB color scheme.

13. The optical display device according to claim 1, wherein said color scheme comprises a subtractive CMYK color scheme.

14. The optical display device according to claim 1, wherein said first and second nanostructure arrays each comprise a plurality of nanoholes formed in said substrate, said nanoholes comprising one or more of a circular, substantially round, elliptical, rectangular, triangular or square geometry.

15. A method of manufacturing an optical display device for providing a visual authentication method, comprising:
   forming on a substrate, said substrate comprising a surface, a first pixel of a color image by:

forming a first optical nanostructure array on said substrate surface to form a first sub-pixel of said first pixel of a color image;

forming a second optical nanostructure array on said substrate surface to form a second sub-pixel of said first pixel of a color image;

wherein said first and second sub-pixels define a first color of said first pixel of said color image according to an additive or subtractive color scheme; and forming on said substrate a second pixel of said color image by:

forming a third optical nanostructure array on said substrate surface to form a first sub-pixel of said second pixel of said color image;

forming a fourth optical nanostructure array on said substrate surface to form a second sub-pixel of said second pixel of said color image;

wherein said first and second sub-pixels define a second color of said second pixel of said color image according to an additive or subtractive color scheme;

wherein said first, second, third and fourth nanostructure arrays each comprise a plurality of nanostructures and said nanostructures comprise one or more of nanoholes and nano-columns formed on or in said surface of said substrate, and wherein said first optical nanostructure array comprises nanostructures with a periodic spacing of 380 nm to 580 nm to produce a blue or green color by first order diffraction and the second optical nanostructure array comprises nanostructures with a periodic spacing of 580 nm to 680 nm to produce a red color by first order diffraction, whereby the first and second optical nanostructure arrays diffractively provide by the reflection of an incident light source the different colored sub-pixels of said first pixel.

16. The method of manufacturing an optical display device according to claim 15, wherein forming said first and second nanostructure arrays comprises one or more of printing, imprinting, embossing, stamping, molding, etching or inscribing said nanostructure arrays in or on said substrate surface.

17. The method of manufacturing an optical display device according to claim 15, wherein forming said first and second nanostructure arrays comprises writing said first and second nanostructure arrays by means of electron beam lithography.

18. The method of manufacturing an optical display device according to claim 15, additionally comprising attaching said substrate to a security article as an optical security authentication device.

\* \* \* \* \*